United States Patent [19]
Weiblen et al.

[11] Patent Number: 5,248,028
[45] Date of Patent: Sep. 28, 1993

[54] APPARATUS FOR FIRING PRINTED MATTER ONTO SUBSTRATES

[75] Inventors: Kurt Weiblen, Metzingen; Hans-Martin Irslinger, Wannweil, both of Fed. Rep. of Germany

[73] Assignee: Robert Bosch GmbH, Stuttgart, Fed. Rep. of Germany

[21] Appl. No.: 865,084

[22] Filed: Apr. 8, 1992

[30] Foreign Application Priority Data

May 4, 1991 [DE] Fed. Rep. of Germany ....... 4114639

[51] Int. Cl.$^5$ .............................................. B65G 15/42
[52] U.S. Cl. .......................... 198/803.14; 198/803.01
[58] Field of Search ................... 198/803.01, 803.11, 198/803.14, 465.1, 465.2

[56] References Cited

U.S. PATENT DOCUMENTS

| | | | |
|---|---|---|---|
| 316,172 | 4/1885 | Potts | 198/803.11 |
| 2,639,025 | 5/1953 | Schmitt | 198/803.11 X |
| 3,085,676 | 4/1963 | Hinchcliffe | 198/803.14 X |
| 3,133,496 | 5/1964 | Dubuit | 198/803.14 X |
| 4,635,788 | 1/1987 | McDonald | 198/848 |
| 5,115,905 | 5/1992 | Hollinger, II | 198/803.01 X |

FOREIGN PATENT DOCUMENTS

| | | |
|---|---|---|
| 3004606 | 8/1981 | Fed. Rep. of Germany . |
| 3027896 | 7/1984 | Fed. Rep. of Germany . |
| 3539959 | 10/1987 | Fed. Rep. of Germany . |
| 3915278 | 11/1990 | Fed. Rep. of Germany . |

OTHER PUBLICATIONS

IBM Technical Disclosure Bulletin, vol. 25, No. 11B, Apr. 1983.
IBM Technical Disclosure Bulletin, vol. 24, No. 4, Sep. 1991.
IBM Technical Disclosure Bulletin, vol. 27, No. 12, May 1985.

Primary Examiner—Robert P. Olszewski
Assistant Examiner—James R. Bidwell
Attorney, Agent, or Firm—Frishauf, Holtz, Goodman & Woodward

[57] ABSTRACT

In electronics manufacturing, it is conventional to print a film onto a substrate (1) and then fire it in a continuous oven. A sequence of substrates is fed through the continuous oven on a conveyor belt (9). In order to fire substrates, even substrates printed on both sides, without damaging the films, the apparatus of the present invention employs wedge-shaped holders (5) which support each substrate only at its edges. The holders are secured to the belt (9) by securing shafts (15) which pass through loops or voids in the mesh belt. The shafts are preferably secured by a securing wire (17) passed through them. Wire (17) is kept from pulling out by an eyelet (19). In this manner, even substrates printed on both sides can be fed to the continuous oven without damage.

13 Claims, 1 Drawing Sheet

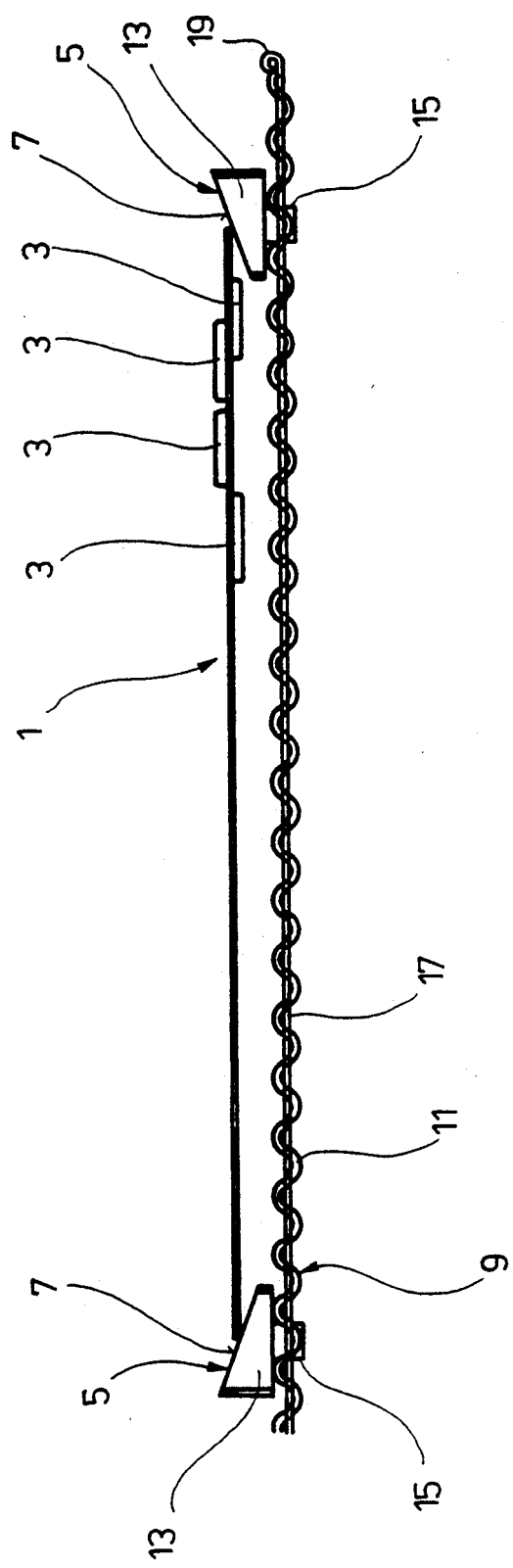

APPARATUS FOR FIRING PRINTED MATTER ONTO SUBSTRATES

FIELD OF THE INVENTION

The present invention relates generally to printed circuits and, more particularly, to conveyor belt and continuous oven apparatus for firing, onto substrates, patterns applied with thick-film techniques.

BACKGROUND

It is conventional to fire or cure thick films printed on a substrate. Typically, these are coatings or paste layers applied to the top surface of the substrate. Such layers serve later for manufacture of individual components on the substrate. In order to fire these coatings, the substrates are conveyed on a heat-resistant belt, e.g. a steel mesh or link belt, through a continuous oven having inlet- and outlet-openings. The speed of travel of the mesh belt is chosen such that the paste layers on the substrate are, given a predetermined internal oven temperature, sufficiently fired during one passage through the oven.

The disadvantage of these known devices is that, during the movement of the substrate, the surface of the substrate facing the mesh belt can be seriously damaged.

THE INVENTION

The apparatus of the present invention has wedge-shaped holders which minimize contact with the underside of the travelling substrates. Thus, during transport through the oven, damage to the belt-adjacent face of the substrates is prevented.

The fact that, during their trip through the continuous oven, the substrates are held only at their edge regions, makes it possible to subject substrates coated on both sides to a single firing process.

The preferred embodiment of the apparatus features wedge-shaped holders which have a holding portion with an upper surface which slopes downward toward the longitudinal center of the conveyer belt. The holders are so arranged on the mesh belt that the sloping upper surfaces, of two opposing holders, face each other. For purposes of the invention, it immaterial whether the substrates are supported at their leading and trailing edges or, alternatively, at their left and right side edges.

The preferred embodiment of the apparatus features holders with a securing region formed as a shaft which slips into a link or void in the mesh belt. The holding portion, however, is dimensioned so that it cannot slip through the link or void. In this manner, the holders can be easily set in place on the belt, so that successive substrates may have different dimensions but be subjected to the same firing process. The matching to the various sizes can be done quickly.

Another preferred feature is that the securing shafts each have a hole through which a securing wire can be fed. Thus, vibrations will not bounce the holders out of the belt, so that substrate damage during transport is even more reliably avoided.

Another preferred feature is that the sloping surface of the holder has at least one rib or groove. In this manner, the contact surface between substrate and holder is further minimized. Thus, damage caused by the holders or impurities which might rub off the holder onto the surface of the substrate, is drastically reduced.

Particularly preferred in an arrangement in which the holders are secured to the belt in rows of side-by-side and one-after-another holders. In this manner, many substrates can travel one after another through the oven, and matching of various sizes of substrates can be readily carried out.

DRAWING

FIG. 1 illustrates schematically a side view of a mesh belt bearing two holders, which are supporting a substrate.

DETAILED DESCRIPTION

In FIG. 1, the horizontal double line indicates substrate 1, printed on both sides with thick films. For clarity, paste films or layers 3 are indicated, with exaggerated thickness, on the upper and lower faces of substrate 1.

At respective end regions of substrate 1, two holders 5 are indicated. Holders 5 each feature, adjacent substrate 1, a downwardly-ramped receiving surface or support surface 7 for substrate 1.

Beneath substrate 1 and its holders 5, there is a mesh conveyor belt 9, preferably in the form of a steel mesh element belt. Mesh belt 9 is schematically represented by a sinusoidal or wavy wire 11.

Holders 5 feature a holding region 13, on which substrate 1 rests. Beneath holding regions 13, one can recognize securing pins 15, which serve as means for laterally securing holders 5 with respect to belt 9. Pins 15 are so dimensioned that they slip into loops or voids of mesh belt 9. Holding regions 13, on the other hand, are dimensioned sufficiently large, with respect to the voids, that the holders cannot slip into belt 9. Pins 15 are so dimensioned with respect to the surrounding loops that they remain in an essentially vertical orientation, despite any sidewise torque induced by the weight of substrate 1, and thereby serve to anchor holders 5 in position on mesh belt 9.

Holders 5 are so spaced that the edges of substrate 1 make contact about midway down ramped support surfaces 7, which fall off or slope toward mesh belt 9 below. This assures that, even in case of vibrations, substrate 1 will not readily slip off holders 5. Further, substrate 1 is kept a predetermined distance above mesh belt 9, so that the paste layers 3 on the underside of substrate 1 cannot come into contact with the mesh belt, which would give rise to damage to the paste layers.

Holders 5 are additionally secured by a securing wire 17 which passes through suitable apertures in securing pins 15 and is integrated into mesh belt 9. Preferably, wire 17 bisects each wave or ripple of the mesh belt, passing horizontally from one securing pin 15 to another, as indicated schematically by two horizontal lines. At the end of securing wire 17, an eyelet 19 is shown, which stands in engagement with the end region of the mesh belt, so that securing wire 17 cannot pull out.

In an embodiment featuring an endless mesh belt, securing wire 17 is anchored at the side edges of the belt.

According to the width of holders 5 and upon the length of the associated side corners of substrate 1, the number of holders must be matched to the dimensions of the substrate. Preferably, two holders 5 are provided per side edge of substrate 1, so that canting of the substrate is reliably avoided.

For the functioning of the apparatus, it is immaterial whether holders 5 engage at the substrate side edges or, alternatively, at the substrate longitudinal edges.

On conveyer belt, on can readily arrange multiple rows or sequences of holders 5, side-by-side or behind one another, whose spacing is matched to the dimensions of the substrate 1 to be held. In this connection, it is easy to insert holders 5 in various links of mesh belt 9, so that even substrates of differing sizes can readily be secured. It will be apparent that refitting or retooling of the apparatus is possible, indeed simple.

In order to reduce, to a minimum, damage and soiling of substrate 1, the upper surface of holders 5, that is, the surface 7 which slopes down toward the mesh belt 9, can be formed with a ribs which may have, for example, a triangular cross-section. This results in only pointlike contact between substrate 1 and the upper surface of wedge-like holders 5.

Ceramic holders have been found to be particularly heat resistant, and trouble-free in terms of soiling of substrate 1. These are preferably press-formed or sintered elements. Aluminum oxide (AL$_2$O$_3$) has been found to be particularly suitable.

In order for substrate 1 to be merely placed on holders 5, a full automatic loading and unloading of the apparatus can be carried out. There are practically no limitations on the form of the substrates. Further, the structure of the paste layers applied to the back side of the substrate is freely selectable. Making the holders electrically insulating reliably protects the substrates 1 from environmental influences such as static discharge.

Ceramic holders are very lightweight, so that densely packing substrates on the conveyor belt is readily possible, since the belt loading rises only an insubstantial amount.

From the foregoing, it will be apparent that even previously manufactured conveyor apparatus can be simply and cost-effectively retrofitted with the present invention.

Various changes and modifications are possible within the scope of the inventive concept.

We claim:

1. Apparatus for firing printed matter (3) onto substrates (1) by passage through a continuous oven, comprising a conveyor belt (9) formed with a plurality of apertures, and a plurality of holders (5) interengaging with said belt apertures and adapted to support each substrate by edge regions thereof, said holders being each formed with a wedge-shaped cross-section and a holding portion (13) with an upper surface (7) which slopes downward toward a longitudinal centerline of said conveyor belt (9), thereby forming a support surface (7) which minimizes contact between said holder and any printed matter on an underside of one of said substrates (a).

2. Apparatus according to claim 1, further comprising means (15) for securing said holders (5) in engagement with said belt (9).

3. Apparatus according to claim 1, further comprising means (15) for securing said holders (5) in engagement with said belt (9).

4. Apparatus according to claim 3, wherein
   said conveyor belt is a mesh belt with vertical voids,
   said means (15) for securing is a securing shaft portion of each holder (5), adapted for insertion through one of said vertical voids, and
   said holding portion (13) of each holder (5) is so dimensioned that it cannot pass through said mesh belt (9).

5. Apparatus according to claim 4, further comprising means (17) for holding said securing shaft in position.

6. Apparatus according to claim 5, wherein said means for holding is a wire (17) passing through said securing shaft.

7. Apparatus according to claim 6, wherein said wire (17) is integrated into said mesh belt (9) and serves to secure a plurality of said holders in position.

8. Apparatus according to claim 7, further comprising means (19) for retaining said wire (17) within said belt.

9. Apparatus according to claim 6, wherein said retaining means is an eyelet (19) connected to an end of said wire.

10. Apparatus according to claim 1, wherein at least two holders (5) are provided for each substrate.

11. Apparatus according to claim 1, wherein said holders (5) comprise a ceramic material.

12. Apparatus according to claim 11, wherein said ceramic material consists essentially of aluminum oxide.

13. Apparatus according to claim 1, wherein said holders (5) are made by press-forming.

* * * * *